United States Patent
Nawrocki

(10) Patent No.: US 9,886,146 B2
(45) Date of Patent: Feb. 6, 2018

(54) ACTIVE GRAPHENE TOUCH SWITCH FOR ELECTRONIC DEVICES

(71) Applicant: Piotr Nawrocki, Inowroclaw (PL)

(72) Inventor: Piotr Nawrocki, Inowroclaw (PL)

( * ) Notice: Subject to any disclaimer, the term of this patent is extended or adjusted under 35 U.S.C. 154(b) by 0 days.

(21) Appl. No.: 14/571,221

(22) Filed: Dec. 15, 2014

(65) Prior Publication Data

US 2016/0170520 A1    Jun. 16, 2016

(51) Int. Cl.
*G06F 3/045* (2006.01)
*G06F 3/044* (2006.01)
*G06F 3/02* (2006.01)
*H03K 17/96* (2006.01)
*C01B 32/182* (2017.01)

(52) U.S. Cl.
CPC ............ *G06F 3/044* (2013.01); *G06F 3/0202* (2013.01); *H03K 17/962* (2013.01); *C01B 32/182* (2017.08); *H03K 2017/9602* (2013.01); *H03K 2217/960765* (2013.01)

(58) Field of Classification Search
USPC ................ 345/173, 174, 156, 158; 327/517; 445/24; 178/18.01
See application file for complete search history.

(56) References Cited

U.S. PATENT DOCUMENTS

| 8,638,314 | B2 * | 1/2014 | Sleeman | G06F 3/0412 178/18.01 |
| 2010/0093247 | A1 * | 4/2010 | Jiang | B82Y 10/00 445/24 |
| 2010/0097346 | A1 * | 4/2010 | Sleeman | G06F 3/0412 345/174 |
| 2011/0080355 | A1 * | 4/2011 | Gruner | G06F 3/044 345/173 |
| 2012/0319976 | A1 * | 12/2012 | Ahn | G06F 3/045 345/173 |
| 2013/0176072 | A1 * | 7/2013 | Kim | H03K 17/96 327/517 |
| 2015/0062028 | A1 * | 3/2015 | Go | G06F 1/1616 345/173 |
| 2015/0130746 | A1 * | 5/2015 | Jung | B32B 37/025 345/174 |
| 2015/0241908 | A1 * | 8/2015 | Ozyilmaz | H01L 41/193 345/174 |

OTHER PUBLICATIONS

Amal Kasry et al., "Electrical and optical properties of graphene mono—and multi-layers; towards graphene-based optoelectronics", IEEE, 2010, pp. 119-120.*

* cited by examiner

*Primary Examiner* — Thuy Pardo
(74) *Attorney, Agent, or Firm* — Masuvalley & Partners

(57) ABSTRACT

Embodiments of the present invention provides a touch switch "touch to turn" for electronic devices. More specifically, it provides a touch interface including an active graphene element which is contained in a housing or on a working surface of an electronic device. The active graphene element includes at least one layer of graphene arranged on a polymer layer. This active graphene element is electrically connected to the electronic device in such a way that touching the active graphene element causes a change in the state of said electronic device, in particular, causing the electronic device to be turned ON or turned OFF. This disclosure further encompasses the use of such touch switches in electronic devices.

10 Claims, 6 Drawing Sheets

ACTIVE GRAPHENE TOUCH SWITCH FOR ELECTRONIC DEVICES

RELATED APPLICATIONS

The present invention claims priority to European Patent Application No. EP14460120.0 filed Dec. 10, 2014 entitled Wyłącznik dotykowy "touch to turn" dla urządzeń elektronicznych, zwłaszcza interfejsu dotykowego, zawierający cy aktywny element grafenowy, which is incorporated herein by reference in its entirety.

TECHNICAL FIELD

The present invention relates to electronic switching devices. More specifically, it relates to a touch switch "touch to turn" electronic device having a touch interface of composite material based on graphene. In particular the notified technology includes a method of operation and use of the touch interface using composite material based on the example—a polymer-graphene layer, allowing the user to communicate with the electronic device. This technology will be an integral part of electronic devices and aims to improve the functionality through the automatic excitation of devices or going into sleep mode.

BACKGROUND OF THE INVENTION

There are three types of haptics: capacitive, resistive, and piezoelectric. Capacitive touch systems, although they have been known to engineers for years, have only recently become a viable alternative to mechanical switches used in consumer electronics. The main reason was the progress in the technology of programmable integrated circuits combining in one piece analog and digital circuits. Typical capacitive touch systems can be switched by a finger approaching them at a distance of less than 3 mm. However, for larger distances, for example, when it is desirable for a switch to be placed behind thick glasses, the detection of the actual approximation of the finger becomes problematic.

The operation of the capacitive circuits is based on the phenomenon of the impact of the electric field with conductors, in particular the human body, which is filled with electrolytes and surrounded by a conductive layer of lossy dielectric—the skin. The electronic component that produces the electric field is obviously a capacitor and as with any capacitor each part of the field goes out the covers. This field is called the boundary field. The system of covers in the touch switch is designed so that the field is the greatest and directed to the area available to the user's finger. It can be seen that the capacitor with parallel covers is not a good structure in this case, because the produced boundary field is minimal. The finger located in the boundary electric field introduces a certain capacity into the chip, which is called touch capacitance (CD). The capacity of the switch without the presence of a finger in a field boundary is defined as proper capacitance (CP). The widespread belief that for the correct operation of capacitive circuits the finger must be grounded, is wrong. The presence of the finger is detected by the boundary field, as it can store charge, and this fact does not affect its possible grounding.

Referring first to FIG. 1, an embodiment of a prior art capacitive touch system, e.g., capacitor, is shown. The diameter of the pillow switch for this example is 10 mm, which is the average size of an adult human fingertip. The mass is also on the top side of the plate, whereby the pillow-mass system can be regarded as a capacitor in which a large part of the energy is stored on the surface of the plate. The pad is isolated from the mass with a ring-shaped gap, the width of the gap is an important design parameter. If it is too small, most of the energy of the electric field "escapes" directly to the mass. However, if it is too large, it becomes impossible to control the marginal distribution of the electric field.

For proper operation of the system, an appropriate choice of the current of the current source and operating frequency of the generator is also necessary. By default, the current source is about 14 pA and the capacitance measurement time for a single switch is 500 ms. From the analysis of the counts plate and differential switch plate it can be concluded that each switch has its proper capacity (CP) of about 15 pF and tactile capacity (CF) of about 0.5 pF. Therefore, pressing the system alters the total capacity of the system by about 3%. The main advantage of the capacitive touch systems over their mechanical counterparts is that they do not wear out during the operation. However, only the progress in recent years in the field of signal processing has greatly reduced the costs and increase their sensitivity and reliability.

Resistance haptics require two electrodes, which require contact (short circuit) with a conductive element (e.g. by touching a finger). They work by reducing the resistance between the electrodes. Such systems are much simpler to build in comparison to capacitive systems. Putting, for example, one or two fingers on the plates to achieve the status of a circuit switched on or closed, and moving away the finger (fingers) switches the device off. Piezoelectric touch system works on the principle of mechanical impact on the piezoceramic elements, usually built directly behind the surface. This solution allows for the construction of tactile interfaces of each type of material. Current solutions allow the construction of such systems in such a way as touching with a force of 1.5 N is sufficient even for rigid materials such as stainless steel.

In the prior art KR 20130091493 (A), a graphene touch panel that includes etched graphene layer combined with an organic insulator is disclosed. The invention particularly relates to a method for manufacturing the touch panel by gluing etched graphene layer (208) using a polymer punch and organic solvent, and imprinting it on the base substrate (202). Glass or plastic selected from polyethylene terephthalate (PET), polyethylene naphthalate (TEN), polyethersulfone (PES), and polycarbonate (PC) are used as such a substrate.

From the KR 20130055111 publication, a graphene touch panel including a layer of graphene (24) on a substrate (10) is also disclosed. The invention particularly relates to a method for the preparation of the graphene layers of the touch panel by forming the starting graphene oxide film (20) on the substrate (10) and its attachment to the substrate by a process of injection of nitrogen gas and carbon dioxide gas into the chamber and then through the laser irradiation of the graphene oxide film a graphene film (24) is obtained.

In addition, touch screen including etched conductive graphene layer, made by laser etching on this screen is known from the CN 103071925 publication. All publications cited above disclose touch screens comprising a layer of graphene on substrates, including glass or plastic, where the graphene layers are formed and fixed in different manners to the surface of the touch panel.

Therefore, the object of this invention is to provide a novel touch switch comprising a layer of graphene polymer based on flexible graphene nanocomposite which allows to increase the functionality of the electronic devices in their excitation and/or transition to sleep mode.

SUMMARY OF THE INVENTION

In accordance with one aspect of the present invention, there is provided a touch switch "touch to turn" for electronic devices. The touch switch includes a touch interface having an active graphene element, optionally contained in a housing or on the working surface of an electronic device, characterized in that the active graphene element comprises at least one layer of graphene arranged on a polymer layer, polymer, and electrically connected to the electronic device in such a way that touching the active graphene element causes the change in the state of an electronic device, in particular turning it on or off.

Preferably, the touch switch in accordance with the invention includes a control circuit electrically connected to the layer of graphene on the polymer layer, optionally controlled by the control software.

Preferably, the graphene layer disposed on the polymer layer has a round tubular shape or belt flat shape.

Preferably graphene layer is in a two-dimensional form having a thickness of one atom or more than one atom or three dimensional and preferably they are nanotubes arranged in different directions, in particular parallel or perpendicular to the surface of the polymer.

Preferably, the graphene in the graphene layer in its pure or doped form.

Preferably, said polymer layer is a polymer selected from the group consisting of polyethylene terephthalate (PET), polyethylene naphthalate (TEN), polyethersulfone (PES), and polycarbonate (PC), polypropylene (PP), poly(ethylene oxide) (PEO), poly(vinyl chloride) (PVC), synthetic rubber, most preferably: polyethersulfone (PES), polycarbonate (PC).

Preferably, the touch switch according to the embodiments of the present invention is a capacitive switch.

The invention further includes the use of such a touch switch in electronic devices, especially mobile phones (including smartphones), workstations, where touch nanocomposite layer is placed on the working surface, especially in the back of the seats, steering wheels for vehicles, remote controls for electronic equipment, handles in electronic equipment.

BRIEF DESCRIPTION OF THE DRAWINGS

The present disclosure is described in conjunction with the appended figures.

Figure 1:
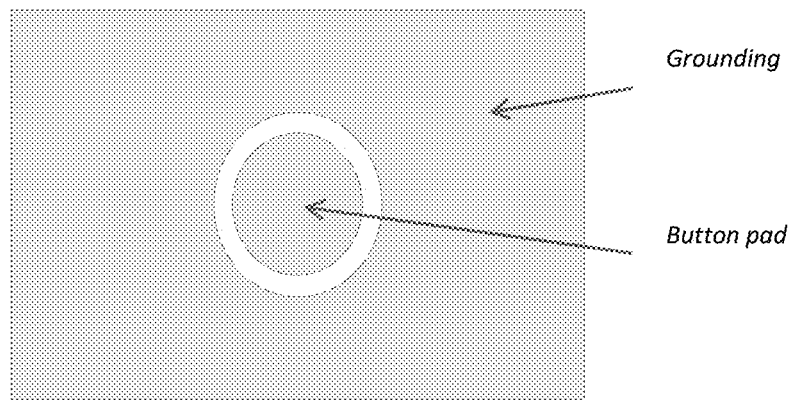
FIG. 1 schematically illustrates a prior art capacitor, which is one embodiment of a known capacitive touch system.

In the appended figures, similar components and/or features may have the same reference label. In the following detailed description of the preferred embodiment(s), the main structural elements are respectively indicated by the following reference numerals: 1—touch interface "touch to turn"; 2—control circuit, interface, or system; 3—control software, interface or system; 4—graphene layer of the active graphene element, and in FIG. 3 P is a polymer, G—graphene, and DG—doped graphene.

DETAILED DESCRIPTION OF THE INVENTION

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment(s) of the disclosure. It should be understood that various changes may be made in the function and arrangement of elements without departing from the spirit and scope of the invention as set forth in the appended claims.

The present invention relates in general to electronic switching devices. More specifically, it relates to a touch switch "touch to turn" electronic device having a touch interface of a composite material based on graphene. In particular the notified technology includes a method of operation and use of the touch interface using the composite material based upon the specific example of a polymer-graphene layer, allowing the user to communicate with the electronic device.

This technology will be an integral part of electronic devices and aims to improve the functionality through the automatic excitation of devices or going into sleep mode. The polymer-graphene layer may be formed as a part of the software controlled system, which is plugged into the electronic devices. The use of this solution will take place in commercial electronic equipment, as well as special equipment, since the technology will have major impact on the change of the parameters generated by the application of the above devices.

Example 1—Interface "Touch to Turn"

Figure 2:
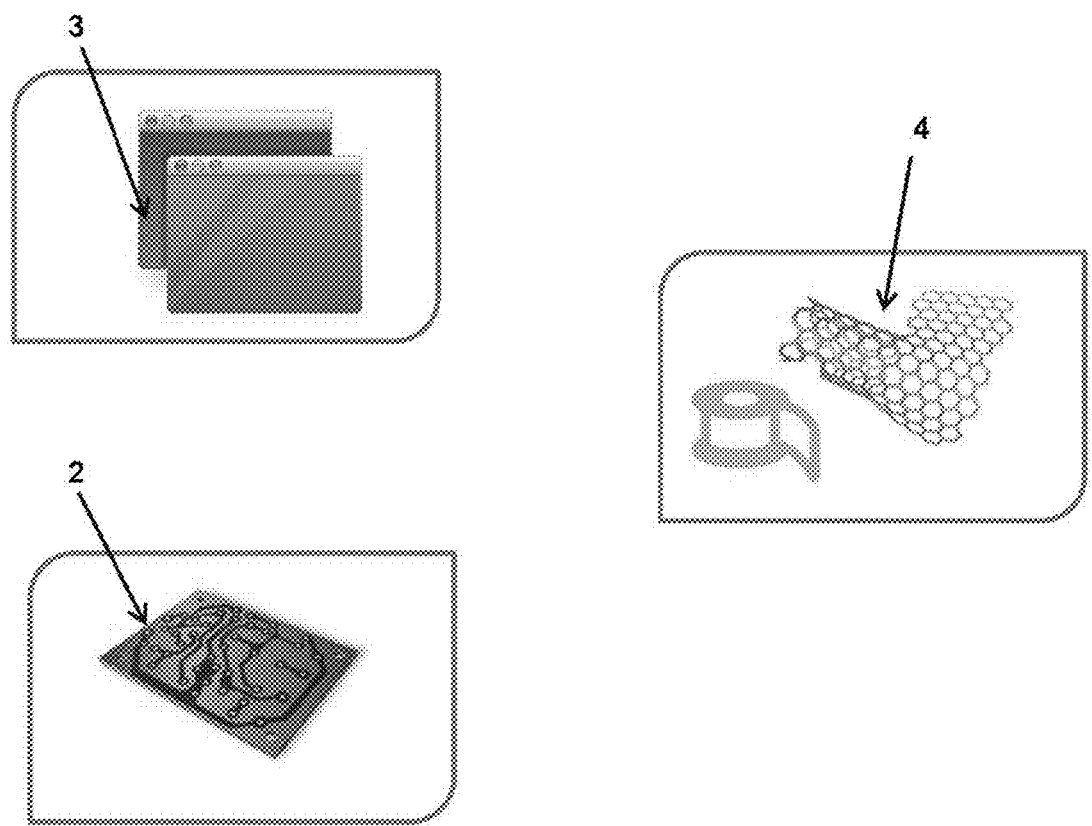
FIG. 2 illustrates touch interface "touch to turn" items in accordance with the present invention, including: an elastic graphene nanocomposite layer as an active graphene component, preferably in the form of a tape, and a control circuit and control software.

According to one embodiment of the present invention, the interface "touch to turn" 1 includes a nanocomposite material consisting of three components (FIG. 2). The main element is a flexible layer of nanocomposite material as the active graphene component 4. In addition, the interface may include the control circuit 2 and/or the control software 3. Please note that the use of control system 2 and control software 3 is optional, depending on the design requirements and the technical possibilities available when creating a device according to the invention, when the interface is to be used.

Flexible nanocomposite material 4 (FIGS. 3 and 5)—is a heterogeneous material structure composed of two or more components with different properties. The properties of the composites are not the sum or average of the properties of its components, and the material used exhibits anisotropy of physical properties in its construction. By way of example, one of the components may be an adhesive, in this embodiment, any polymer P, in particular selected from the group consisting of polyethylene terephthalate (PET), polyethylene naphthalate (TEN), polyethersulfone (PES), and polycarbonate (PC), polypropylene (PP), poly(ethylene oxide) (PEO), poly(vinyl chloride) (PVC), synthetic rubber, and most preferably polyethersulfone (PES), polycarbonate (PC), which guarantees the consistency, hardness, flexibility and resistance to compression. The second component may be a monatomic layer of graphene, which provides conductive properties while maintaining the transparency of the material.

Graphene (G) has all the properties corresponding to the requirements of the production of nanocomposite material for an interface, for example, very good heat and electricity conductivity, low resistivity, high transparency, and properties of a semiconductor. The structure of the nanocomposite material of the interface "touch to turn" according to the embodiments of the present invention takes into account:

using more layers of graphene in the material—the number of mononuclear layers depends on the conditions under which the interface will operate, the use of graphene in the form of nanotubes, if the use of the properties of graphene, which is given by such construction are necessary to increase the effectiveness of the interface, and doping of graphene to modify some properties of the material, e.g., optical, electrical, magnetic or mechanical.

Figures 3A, 3B, 3C, 3D:
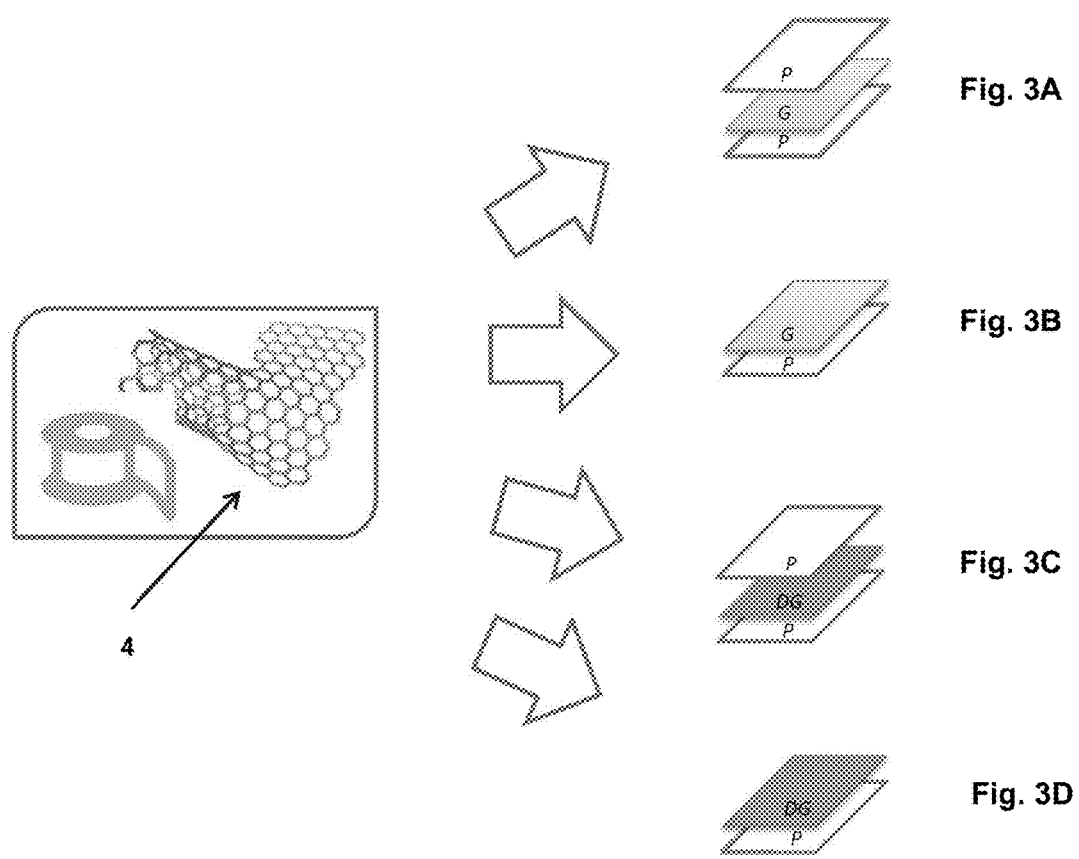
FIG. 3A through 3D illustrates types of flexible nanocomposite layer of the interface in accordance with the present invention.

The properties of graphene fully meet the requirements for the creation of nanocomposite material, which is a major component of the interface "touch and turn" of the present invention. However, one should not be limited to graphene only, if similar conditions are produced using other nanostructures. According to the embodiment of the present invention, the components of the nanocomposite layer of the interface should be made in one of the selected ways, which are shown in FIG. 3A though 3D:

FIG. 3A shows a layer of graphene (two-dimensional or 3D structure, e.g., nanotubes) between two polymer layers with contact leads to the surface of one of the two polymer layers;

FIG. 3B shows a layer of graphene (two-dimensional or 3D structure, e.g., nanotubes) "embedded" on the surface of a single layer of polymer;

FIG. 3C shows a doped layer of graphene (two-dimensional or 3D structure, e.g., nanotubes) between two polymer layers with contact leads to the surface of one of the two polymer layers; or FIG. 3D shows a doped layer of graphene (two-dimensional or 3D structure, e.g., nanotubes) "embedded" on the surface of a single layer of polymer.

At the outset of the design of graphene production process, the polymer which forms the substrate is to be considered. Depending on the first stage, fixing the graphene (G) may be performed by variety of different processes, for example, by changing the physical state of the polymer under the influence of external factors such as temperature, solvents or adhesives or gels of linking properties, etc. This allows for joining the polymer layer and the graphene (G) into a single structure or layer. In this way, the resulting circuit is based on the operation of capacitive circuits.

Figure 4:
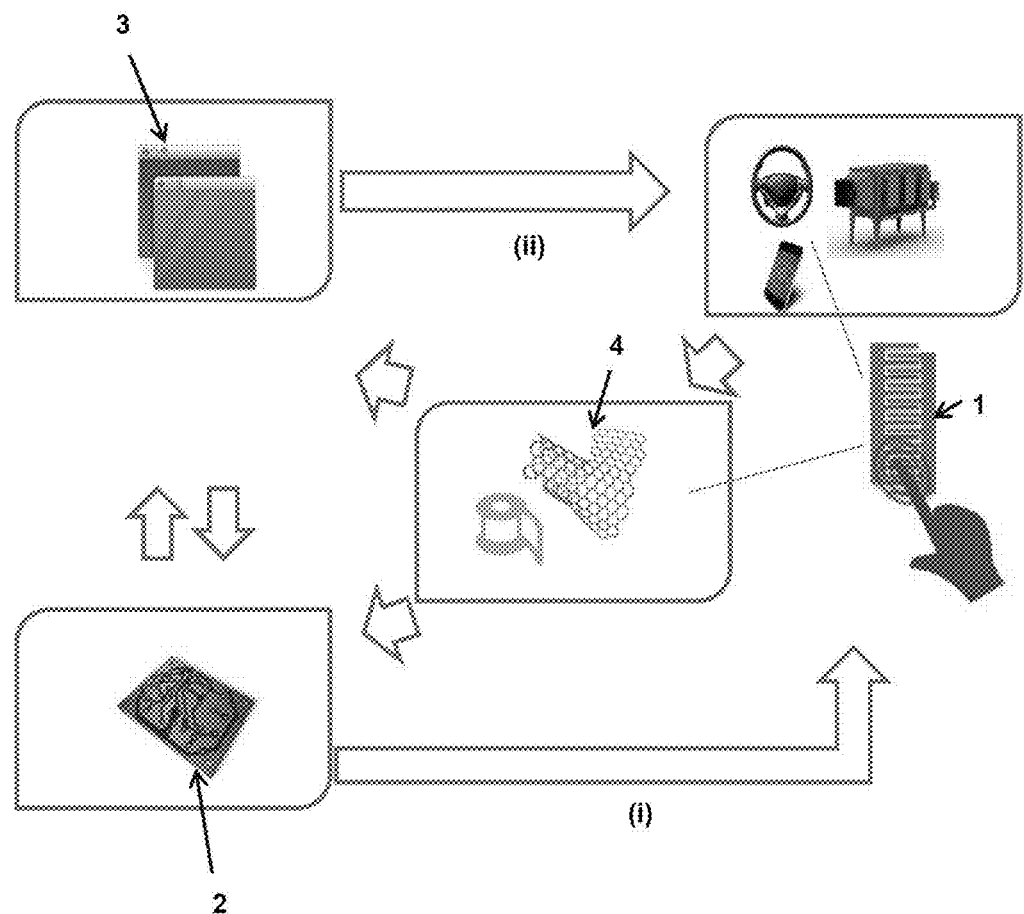
FIG. 4 illustrates the principle of operation of a touch interface.

With reference to FIG. 4, the principle of operation of the interface "touch to turn" is schematically shown in detail. In this figure, the circuit switch 1 represents an example of a touch switch in electronic devices covered with elastic nanocomposite layer 4. In this embodiment, the elastic nanocomposite layer 4 is an active graphene (G) element in the form of a flexible graphene (G) nanocomposite layer. As shown in FIG. 4, the direction of signal transmission from a controller 2 is shown with one arrow symbol (i) and the direction of signal transmission from the control software 3 is shown with the arrow symbol (ii).

Regardless of the technology of construction of the control circuit 2 and the control software 3, when any part of the nanocomposite layer 4 is touched, the circuit switch 1 sends the corresponding information to the control unit 2. The control unit 2 compares this information with the previously programmed data, and if the values agree, it activates a specific function. In this way, it becomes possible to design a contact form on the composite material that allows the interface to operate the touch-sensitive functions in multi-touch technology (the interface surface is touched by different touches at the same time).

In some embodiments and depending on the device, the interface operation does not require the existence of the control circuit 2 and the control software 3 may be an integral part of the device software.

Figure 5:
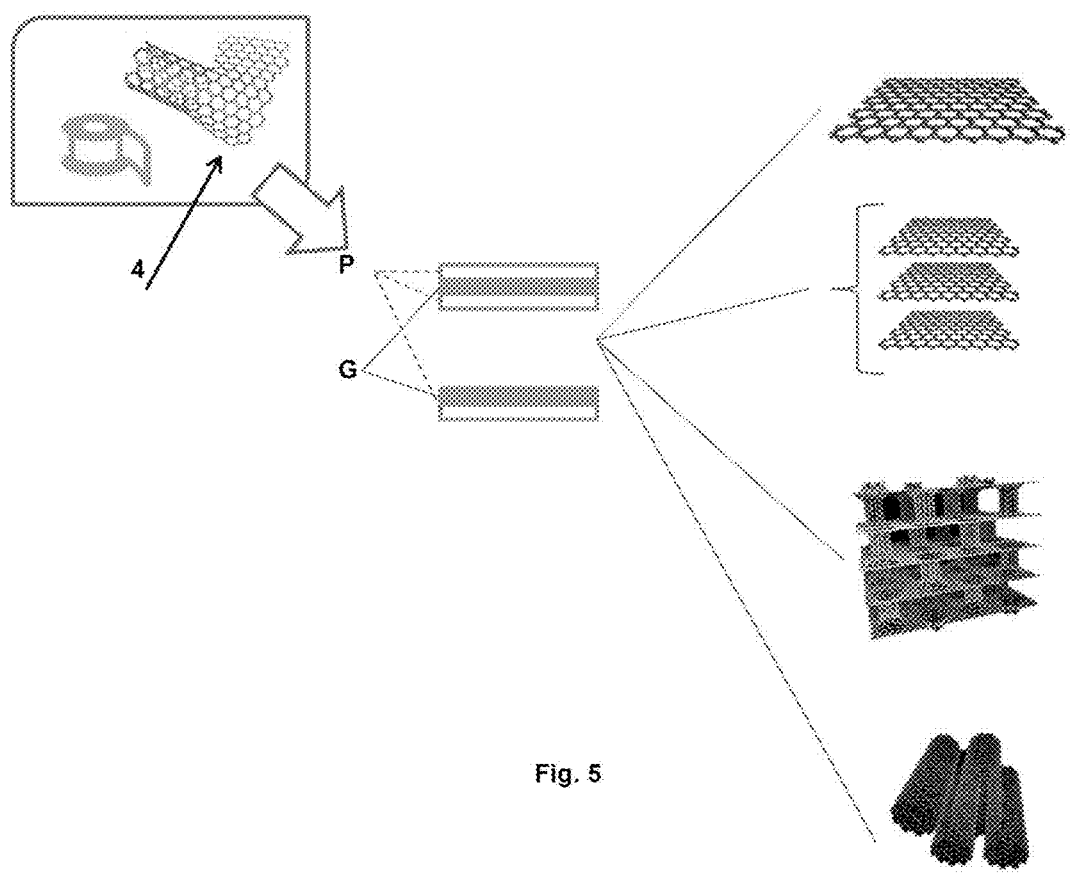
FIG. 5 shows examples of the arrangement of conductive layers in the nanocomponent comprising an elastic graphene nanocomposite layer, two- or three-layer according to the present invention.
Figure 6:
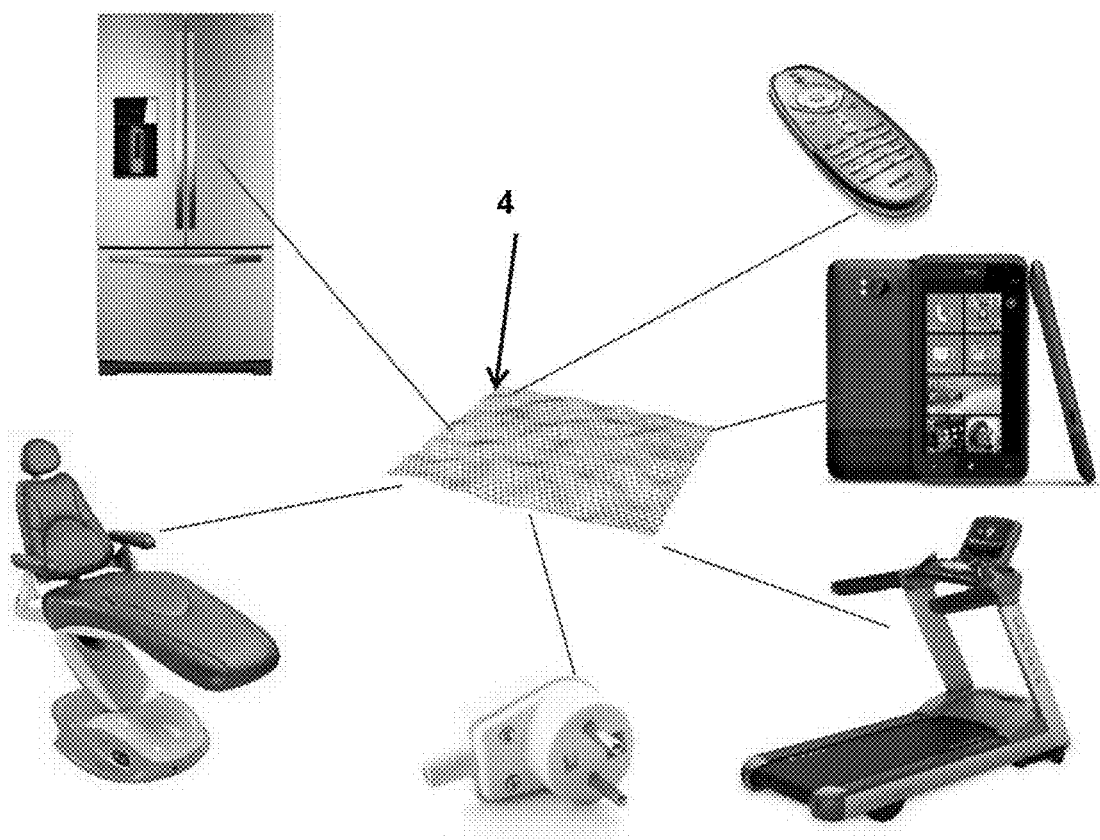
FIG. 6 illustrates examples of the application of the interface in electronic devices, in accordance with the present invention.

Depending on the design, the arrangement of the graphene nanocomposite structure of the switch 1 according to the embodiments of the present invention may take any form that can achieve maximum performance of the interface during its use. Examples of some arrangement of conductive structures in nanocomposite are illustrated in FIG. 5.

In the following, characteristics of an interface with composite material are summarized. The interface with the composite material is resistant to:

moisture and condensation splashing water-damage corrosion ultraviolet dust constant magnetic field changes in temperature in the range −40° C. to +70° C.

can be used as a top layer of devices runs smoothly even in the case of local surface defects Example 2—Application of the Interface "Touch to Turn"

The touch interface according to the embodiments of the present invention can be applied to various electronic devices. By way of example, but not limitation, some applications may be:

mobile phone (smartphone), whose functions are triggered on holding it in the hand (touch nanocomposite layer of the interface is placed in the housing);

work station at which the touch nanocomposite layer is placed e.g. on the working surface, the station is actuated by touching it;

backrests in seats, steering wheels in vehicles, remote controls for electronic equipment, handles in electronic equipment and many other objects in which the use of the interface will increase functionality, or simplifying operation.

Embodiments of the present invention provide methods and structures for construction and use of a conductive layer in a touch interface. Existing haptics have mechanical constraints that are significantly reduced by use of this new touch interface "touch to turn." This is mainly due to their characteristics that results from their nanostructures. Ease of fitting polymer nanolayers into production process of electronic devices with workable touch interface is an important element for having an efficient low cost production system while increasing their functionality.

While the principles of the disclosure have been described above in connection with specific apparatuses, it is to be clearly understood that this description is made only by way of example and not as limitation on the scope of the invention.

What is claimed is:

1. A touch switch (touch to turn) for being used in an electronic device, the touch switch comprises a touch interface comprising an active graphene element, contained in a housing or on a working surface of the electronic device, wherein the active graphene element comprises a graphene nanocomposite layer comprising at least one doped graphene layer disposed on a polymer layer or at least one graphene layer disposed between two polymer layers, wherein a surface of the graphene layer is in contact with a surface of only one of the two polymer layers and is electrically connected to the electronic device in such a way that touching the active graphene element causes the electronic device to turn on or off.

2. The touch switch according to claim 1 further comprises a control circuit, which is electrically connected to the graphene layer disposed between the two polymer layers and is controlled by a control software.

3. The touch switch according to claim 1, wherein the graphene layer disposed between the two polymer layers has a round tubular shape or belt flat shape.

4. The touch switch according to claim 1, wherein the graphene layer is a two-dimensional layer having a thickness of one atom or more than one atom.

5. The touch switch according to claim 1, wherein the graphene layer is a three-dimensional layer having nanotubes structure arranged in different directions.

6. The touch switch according to claim 5, wherein the nanotubes structure is arranged parallel or perpendicular to a surface of one of the two polymer layers.

7. The touch switch according to claim 1, wherein the at least one graphene layer disposed between two polymer layers is in pure and doped form.

8. The touch switch according to claim 1, wherein the polymer layer is selected from the group of polymers including polyethylene terephthalate (PET), polyethylene naphthalate (TEN), polyethersulfone (PES), and polycarbonate (PC) polypropylene (PP), poly(ethylene oxide) (PEO), poly(vinyl chloride) (PVC), synthetic rubber, and most preferably polyethersulfone (PES), polycarbonate (PC).

9. The touch switch according to claim 1, wherein the touch switch is a capacitive switch.

10. Use of the touch switch according to claim 1 in electronic devices, especially, mobile phones including smartphones and workstations, where touch nanocomposite layer is placed on the working surface of the electronic devices, especially, in back seats and steering wheels of vehicles, or remote controls and handles of electronic equipment.

* * * * *